(12) United States Patent
Lee

(10) Patent No.: US 8,905,680 B2
(45) Date of Patent: Dec. 9, 2014

(54) ULTRATHIN WAFER TRANSPORT SYSTEMS

(71) Applicant: Masahiro Lee, Tokai (JP)

(72) Inventor: Masahiro Lee, Tokai (JP)

( * ) Notice: Subject to any disclaimer, the term of this patent is extended or adjusted under 35 U.S.C. 154(b) by 0 days.

(21) Appl. No.: 13/653,408

(22) Filed: Oct. 17, 2012

(65) Prior Publication Data

US 2013/0108378 A1    May 2, 2013

Related U.S. Application Data

(60) Provisional application No. 61/553,866, filed on Oct. 31, 2011, provisional application No. 61/586,149, filed on Jan. 13, 2012.

(51) Int. Cl.
*B65G 47/24*    (2006.01)
*H01L 21/683*    (2006.01)
*B65G 51/03*    (2006.01)

(52) U.S. Cl.
CPC .......... *H01L 21/6838* (2013.01); *B65G 51/035* (2013.01)
USPC ............................... 406/87; 269/21; 294/64.3

(58) Field of Classification Search
USPC .......... 406/87, 88; 269/20, 21; 294/64.2, 64.3
See application file for complete search history.

(56) References Cited

U.S. PATENT DOCUMENTS

| | | | |
|---|---|---|---|
| 3,438,668 A * | 4/1969 | Williams et al. ............. | 294/64.3 |
| 4,137,644 A * | 2/1979 | Karlsson ........................ | 34/460 |
| 4,445,494 A | 5/1984 | Schiele et al. | |
| 4,773,687 A | 9/1988 | Bush et al. | |
| 4,969,676 A * | 11/1990 | LaMagna ..................... | 294/64.3 |
| 5,067,762 A * | 11/1991 | Akashi ........................... | 294/64.3 |
| 5,169,196 A * | 12/1992 | Safabakhsh .................. | 294/64.3 |
| 5,324,155 A | 6/1994 | Goodwin et al. | |
| 5,421,595 A * | 6/1995 | Cripe et al. ....................... | 279/3 |
| 5,492,566 A | 2/1996 | Sumnitsch | |
| 5,513,668 A * | 5/1996 | Sumnitsch .................... | 134/157 |
| 5,685,039 A | 11/1997 | Hamada et al. | |
| 5,979,475 A | 11/1999 | Satoh et al. | |
| 6,022,417 A * | 2/2000 | Sumnitsch .................... | 118/728 |
| 6,099,056 A * | 8/2000 | Siniaguine et al. .......... | 294/64.3 |
| 6,174,011 B1 | 1/2001 | Keigler | |
| 6,197,150 B1 | 3/2001 | Kwag et al. | |
| 6,402,843 B1 * | 6/2002 | Siniaguine et al. ........... | 118/500 |
| 6,427,991 B1 * | 8/2002 | Kao ................................ | 269/21 |
| 6,443,168 B1 | 9/2002 | Morita et al. | |
| 6,601,888 B2 | 8/2003 | McIlwraith et al. | |
| 7,452,016 B2 * | 11/2008 | Tanae ........................... | 294/64.3 |
| 7,510,226 B2 * | 3/2009 | Akiyama ..................... | 294/64.3 |
| 7,669,903 B2 | 3/2010 | Bonora et al. | |
| 7,690,869 B2 | 4/2010 | Yo et al. | |
| 7,875,501 B2 | 1/2011 | Tanaka et al. | |
| 8,419,094 B2 * | 4/2013 | Omiya et al. ................ | 294/64.3 |
| 8,590,953 B2 * | 11/2013 | Chang et al. ................ | 294/64.3 |
| 2007/0254558 A1 | 11/2007 | Kodera et al. | |
| 2010/0290844 A1 | 11/2010 | Voelk et al. | |

* cited by examiner

*Primary Examiner* — William R Harp
(74) *Attorney, Agent, or Firm* — Lodestar Patents, PLLC; Raymond J. E. Hall

(57) ABSTRACT

An improved silicon wafer transport system. More particularly, this invention relates to providing new wafer-transport apparatus having geometries configured to minimize damage to the wafer while assisting in maintaining multi-orientation positioning of the wafer during transport by the tool.

19 Claims, 4 Drawing Sheets

ULTRATHIN WAFER TRANSPORT SYSTEMS

CROSS-REFERENCE TO RELATED APPLICATION

The present application is related to and claims priority from prior provisional application Ser. No. 61/586,149, filed Jan. 13, 2012, entitled "ULTRATHIN WAFER TRANSPORT SYSTEMS"; and, this application is related to and claims priority from prior provisional application Ser. No. 61/553,866, filed Oct. 31, 2011, entitled "ULTRATHIN WAFER TRANSPORT SYSTEMS"; the contents of all of which are incorporated herein by this reference and are not admitted to be prior art with respect to the present invention by the mention in this cross-reference section.

BACKGROUND

This invention relates to providing an improved silicon wafer transport system. More particularly, this invention relates to providing new wafer-transport apparatus having geometries configured to minimize damage to the wafer while assisting in maintaining multi-orientation positioning of the wafer during transport by the tool.

Reliable control of the positioning of a silicon wafer during a transport step or fabrication process is frequently needed during fabrication and processing. Preventing both surface damage and tool-relative movement of an ultra-thin work piece within a semiconductor process tool is particularly challenging. A system to maintain damage-free positioning of such ultra-thin semiconductor wafers and similar articles while moving though such fabrication and processing would be of benefit to many in this field.

OBJECTS AND FEATURES OF THE INVENTION

A primary object and feature of the present invention is to provide a system overcoming the above-mentioned problem(s). It is a further object and feature of the present invention to provide such a system utilizing micro-Bernoulli-based work-piece transport fixtures. It is a further object and feature of the present invention to provide such a system for assisting the transport and positioning of ultrathin wafers using micro-Bernoulli applications with high-pressure air to minimum damage by inducing a dimple-shaped conformation within the work piece, which engages a complementary geometry within the transport tool/fixture.

A further primary object and feature of the present invention is to provide such a system that is efficient, inexpensive, and useful. Other objects and features of this invention will become apparent with reference to the following descriptions.

SUMMARY OF THE INVENTION

In accordance with a preferred embodiment hereof, this invention provides a method relating to the transport of the at least one thin planar workpiece comprising the steps of: positioning the at least one thin planar workpiece adjacent at least one transport tool comprising at least one non-contact positioner using at least one flow of fluid in accordance with Bernoulli's principle; generating at least one localized negative-pressure region adjacent at least one discrete sub-portion of the at least one thin planar workpiece to induce at least one temporary dimple-shaped deflection within the at least one thin planar workpiece; and limiting lateral movement of the at least one thin planar workpiece while the at least one thin planar workpiece is suspended adjacent such transport-assist tool by configuring such at least one transport-assist tool to capture the at least one dimple-shaped deflection induced within the at least one thin planar workpiece. Moreover, it provides such a method further comprising the step of stably transporting the at least one thin planar workpiece between a first location and a second location utilizing at least one transport-assist tool.

Additionally, it provides such a method further comprising the step of stably transporting the at least one thin planar workpiece between a first location and a second location utilizing at least one transport-assist tool.

In accordance with another preferred embodiment hereof, this invention provides a system relating to the transport of the at least one thin planar workpiece comprising: at least one transport-assist tool configured to assist stable transport of the at least one thin planar workpiece between a first location and a second location; wherein such at least one transport-assist tool comprises at least one non-contact positioner configured to assist non-contact positioning of the at least one thin planar workpiece adjacent such at least one transport tool; wherein such at least one non-contact positioner comprises at least one Bernoulli suspender structured and arranged to assist suspension of the at least one thin planar workpiece adjacent the at least one transport-assist tool using at least one flow of fluid in accordance with Bernoulli's principle, and at least one lateral-movement limiter structured and arranged to limit lateral movement of the at least one thin planar workpiece while the at least one thin planar workpiece is suspended adjacent such transport-assist tool; wherein such at least one lateral-movement limiter comprises at least one temporary dimple-deflection inducer configured to assist inducing temporarily at least one dimple-shaped deflection within the at least one thin planar workpiece, and within such at least one transport-assist tool, at least one dimple capturer structured and arranged to assist non-contact capturing of the at least one dimple-shaped deflection induced within the at least one thin planar workpiece; and wherein such at least one dimple-deflection inducer comprises at least one localized negative-pressure inducer configured to assist inducement of at least one localized negative-pressure region adjacent at least one discrete sub-portion of the at least one thin planar workpiece.

Also, it provides such a system wherein such at least one localized negative-pressure inducer comprises at least one fluid director configured to assist directing the at least one flow of fluid in at least one flow pattern generating at least one localized negative-pressure region. In addition, it provides such a system wherein: such at least one fluid director is structured and arranged to assist imparting at least one spiraling motion to the at least one flow of fluid; and such at least one spiraling motion of the at least one flow of fluid produces, within the at least one flow of fluid the at least one localized negative-pressure region. And, it provides such a system wherein such at least one fluid director comprises: at least one channel configured to channel the at least one flow of fluid; wherein such at least one channel comprises at least one inlet to inlet the at least one flow of fluid, at least one discharge outlet to discharge the at least one flow of fluid, and at least one helical path in fluid communication with such at least one inlet and such at least one discharge outlet; wherein such at least one helical path is configured to assist imparting at least one spiraling motion to the at least one flow of fluid on exiting such at least one discharge outlet; and such at least one spiraling motion of the at least one flow of fluid assists the generation of the at least one localized negative-pressure region.

Further, it provides such a system wherein such at least one non-contact positioner further comprises: at least one micro-Bernoulli module structured and arranged to at least comprise such at least one Bernoulli suspender and such at least one lateral-movement limiter; wherein such at least one transport-assist tool comprises at least one receiver configured to removably receive such at least one micro-Bernoulli module; wherein such at least one receiver is configured to supply to such at least one micro-Bernoulli module the at least one flow of fluid when at least one micro-Bernoulli module is engaged within such at least one receiver.

Even further, it provides such a system wherein such at least one transport-assist tool comprises a plurality of such at least one micro-Bernoulli modules. Moreover, it provides such a system wherein each such at least one micro-Bernoulli module comprises; at least one disc-shaped body having at least one outer face, at least one inner face, and at least one circumferential side wall adjoining such at least one outer face and such at least one inner face; a plurality of such at least one channels arranged generally uniformly about such at least one circumferential side wall to assist inducing such at least one localized negative-pressure region; and within such least one outer face, at least one recessed dimple structured and arranged to form such at least one dimple capturer; wherein such at least one recessed dimple is situate generally within such at least one localized negative-pressure region induced by such at least one spiraling motion of the at least one flow of fluid exiting such plurality of such at least one channels. Additionally, it provides such a system wherein such at least one inner face is spaced apart from and substantially parallel to such outer face.

In accordance with another preferred embodiment hereof, this invention provides a method relating to the transport of the at least one thin planar workpiece comprising the steps of: providing at least one transport-assist tool comprising at least one non-contact positioner configured to assist non-contact positioning of the at least one thin planar workpiece adjacent such at least one transport tool; providing within such at least one non-contact positioner at least one Bernoulli suspender structured and arranged to assist suspension of the at least one thin planar workpiece adjacent the at least one transport-assist tool using at least one flow of fluid in accordance with Bernoulli's principle, and at least one lateral-movement limiter structured and arranged to limit lateral movement of the at least one thin planar workpiece while the at least one thin planar workpiece is suspended adjacent such transport-assist tool; configuring such at least one lateral-movement limiter to comprise at least one temporary dimple-deflection inducer configured to assist inducing temporarily at least one dimple-shaped deflection within the at least one thin planar workpiece, and within such at least one transport-assist tool, at least one dimple capturer structured and arranged to assist non-contact capturing of the at least one dimple-shaped deflection induced within the at least one thin planar workpiece; and providing within such at least one dimple-deflection inducer, at least one localized negative-pressure inducer configured to assist inducement of at least one localized negative-pressure region adjacent at least one discrete sub-portion of the at least one thin planar workpiece.

Also, it provides such a method further comprising the step of providing, within such at least one localized negative-pressure inducer, at least one fluid director configured to assist directing the at least one flow of fluid in at least one flow pattern generating at least one localized negative-pressure region. In addition, it provides such a method further comprising the steps of: arranging such at least one fluid director to assist imparting at least one spiraling motion to the at least one flow of fluid; and assisting the production, within the at least one flow of fluid, of the of at least one localized negative-pressure region. And, it provides such a method further comprising the steps of: providing within such at least one fluid director, at least one channel configured to channel the at least one flow of fluid; providing within such at least one channel: at least one inlet to inlet the at least one flow of fluid, at least one discharge outlet to discharge the at least one flow of fluid, and at least one helical path in fluid communication with such at least one inlet and such at least one discharge outlet; arranging such at least one helical path to assist imparting at least one spiraling motion to the at least one flow of fluid on exiting such at least one discharge outlet wherein the generation of the at least one localized negative-pressure region is assisted.

Further, it provides such a method further comprising the steps of: combining such at least one Bernoulli suspender and such at least one lateral-movement limiter within at least one micro-Bernoulli module; configuring such at least one transport-assist tool to removably receive such at least one micro-Bernoulli module; and configuring such at least one receiver to supply to such at least one micro-Bernoulli module the at least one flow of fluid when such at least one micro-Bernoulli module is engaged within such at least one receiver.

Even further, it provides such a method further comprising the step of providing within such at least one transport-assist tool a plurality of such at least one micro-Bernoulli modules. Even further, it provides such a method further comprising the step of configuring each such at least one micro-Bernoulli module to comprise; at least one disc-shaped body having at least one outer face, at least one inner face, and at least one circumferential side wall adjoining such at least one outer face and such at least one inner face; a plurality of such at least one channels arranged generally uniformly about such at least one circumferential side wall to assist inducing such at least one localized negative-pressure region; and within such least one outer face, at least one recessed dimple structured and arranged to form such at least one dimple capturer; situating such at least one recessed dimple generally within such at least one localized negative-pressure region induced by such at least one spiraling motion of the at least one flow of fluid exiting such plurality of such at least one channels. Even further, it provides such a method further comprising the step of arranging such at least one inner face in a spaced apart and substantially parallel orientation relative to such outer face.

In accordance with another preferred embodiment hereof, this invention provides a system relating to the transport of the at least one thin planar workpiece comprising: transport-assist tool means for assisting stable transport of the at least one thin planar workpiece between a first location and a second location; wherein such transport-assist tool means comprises non-contact positioner means for non-contact positioning of the at least one thin planar workpiece adjacent such transport-assist tool means; wherein such non-contact positioner means comprises Bernoulli suspender means for suspending the at least one thin planar workpiece adjacent the at least one transport-assist tool using at least one flow of fluid in accordance with Bernoulli's principle, and lateral-movement limiter means for limiting lateral movement of the at least one thin planar workpiece while suspended adjacent such transport-assist tool means; wherein such lateral-movement limiter means comprises temporary dimple-deflection inducer means for temporarily inducing at least one dimple-shaped deflection within the at least one thin planar workpiece, and within such transport-assist tool means, dimple capturer means for non-contact capturing of the at least one dimple-shaped deflection induced within the at least one thin planar workpiece; and wherein such dimple-deflection inducer means comprises localized negative-pressure inducer means for inducing at least one localized negative-pressure region adjacent at least one discrete sub-portion of the at least one thin planar workpiece.

In accordance with preferred embodiments hereof, this invention provides each and every novel feature, element, combination, step and/or method disclosed or suggested by this patent application.

DETAILED DESCRIPTION OF THE BEST MODES AND PREFERRED EMBODIMENTS OF THE INVENTION

Figure 1:
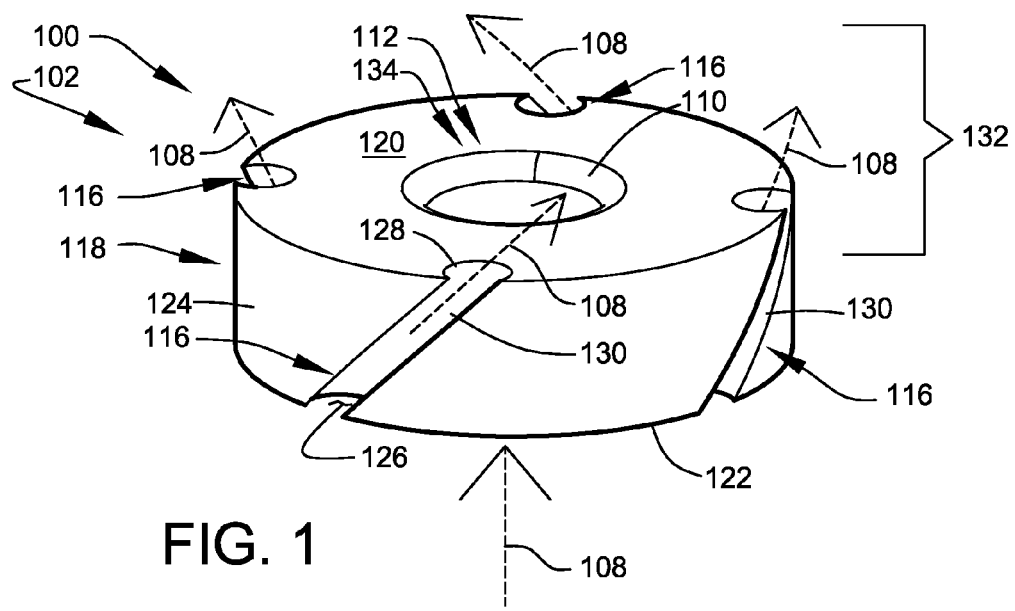
FIG. 1 shows a perspective view, illustrating a micro-Bernoulli module configurable to enhance micro-Bernoulli effects within a transport-assist tool, according to a preferred embodiment of the present invention.
Figure 2:
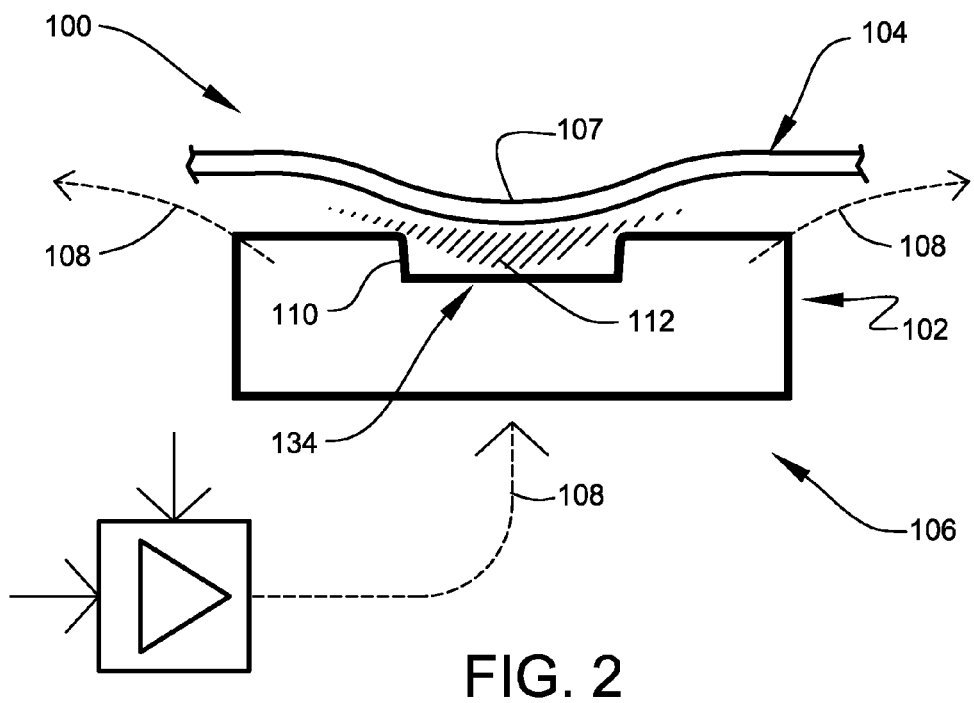
FIG. 2 shows a schematic diagram illustrating a thin planar workpiece positioned adajcent the micro-Bernoulli module of FIG. 1 in a manner limiting relative lateral movement between the two structures.

FIG. 1 shows a perspective view, illustrating a single micro-Bernoulli module 102 configured to enhance micro-Bernoulli effects within a non-contact transport-assist tool, according to a preferred embodiment of non-contact transport system 100. FIG. 2 shows a schematic diagram illustrating a thin planar workpiece 104 positioned adjacent the micro-Bernoulli module 102 of FIG. 1 in a manner limiting relative lateral movement between the two structures.

Non-contact transport system 100 preferably provides, generally stated, a set of preferred system embodiments comprising unique fixture geometries configured to enhance micro-Bernoulli effects within a material transport fixture. Preferred applications include wafer-handling tools used in semiconductor fabrication processes. In particular, the preferred embodiments of the present system are useful in handling thin and ultra-thin silicon wafers (<200 um thick).

Micro-Bernoulli module 102 preferably uses Bernoulli's principal of moving fluids to support the thin planar workpiece 104 in a suspended arrangement requiring no physical contact with the thin planar workpiece 104 beyond the interaction of the working fluid (at least embodying herein at least one non-contact positioner configured to assist non-contact positioning of the at least one thin planar workpiece adjacent at least one transport tool). Briefly stated, Bernoulli's principal in fluid dynamics states that the pressure in a stream of fluid is reduced as the speed of flow is increased.

Preferably, micro-Bernoulli module 102 directs the movement of high speed airflow 108 in an area between the module and the thin planar workpiece 104, such as an ultra-thin semiconductor wafer. The moving airflow 108 creates a localized negative-pressure region 112, providing an attractive force on the thin planar workpiece 104. The workpiece is drawn toward micro-Bernoulli module 102 by the attractive force until it reaches a point of equilibrium wherein the airflow 108 discharged from the module pushes against the thin planar workpiece 104 with an essentially equal but opposing force. It should be noted that lateral stability is also needed maintain relative positioning between the workpiece and the tool. To produce a fully-functional transport tool, it is preferred that a means for lateral support be developed with the apparatus. Transport-assist tool 106 is preferably configured to comprise a unique non-contact means for lateral support of the thin planar workpiece 104 during transport To provide such lateral support, micro-Bernoulli module 102 (at least embodying herein at least one Bernoulli suspender structured and arranged to assist suspension of the at least one thin planar workpiece adjacent the at least one transport-assist tool using at least one flow of fluid in accordance with Bernoulli's principle) preferably comprises a particular geometric arrangement configured to generate a dimple-deflection inducer 105, preferably configured to induce a temporary dimple-shaped deflection 107 within the workpiece, and at least one dimple capturer 134 to assist non-contact capturing of the dimple-shaped deflection 107, as shown. In preferred embodiments of the system, dimple capturer 134 comprises a central recess 110 integrated within micro-Bernoulli module 102, as shown. This preferred arrangement preferably functions to limit lateral movement of the thin planar workpiece 104 during transport by transport-assist tool 106 between a first location and a second location (in combination, at least embodying herein at least one lateral-movement limiter structured and arranged to limit lateral movement of the at least one thin planar workpiece while the at least one thin planar workpiece is suspended adjacent such transport-assist tool).

In more specific terms, micro-Bernoulli module 102 is preferably configured to assist directing airflow 108 (i.e., clean dry air or similar flow of fluid) in at least one flow pattern generating at least one localized negative-pressure region 112 at a location generally coinciding with central recess 110. Preferably, the fluid directing features of micro-Bernoulli module 102 are structured and arranged to assist imparting at least one spiraling motion to airflow 108, as shown. Negative-pressure region 112 is generally expressed as a negative pressure gradient having reduced relative pressures approaching the central region of central recess 110, as shown. It is surmised that such spiraling motion of airflow 108 assists the generation of the above-noted localized negative-pressure region 112 within central recess 110. The resulting mechanical force loads applied to thin planar workpiece 104 (such as an ultra-thin silicon wafer) are preferably engineered to induce at least one non-permanent deflection in a discrete region of the workpiece material located adjacent to central recess 110.

Referring to the illustration of FIG. 1, each micro-Bernoulli module 102 preferably comprises a substantially solid disc-shaped body 118 having an outer face 120, an inner face 122, and a circumferential side wall 124 adjoining outer face 120 and inner face 122, as shown. Inner face 122 is preferably spaced apart from and substantially parallel to outer face 120, as shown.

Each micro-Bernoulli module 102 preferably comprises at least one fluid channel 116 configured to channel the airflow 108 introduced at inner face 122 through disc-shaped body 118. Each channel 116 preferably comprises at least one inlet 126 to inlet airflow 108, at least one discharge outlet 128 to discharge the airflow 108, and least one helical pathway 130 in fluid communication with inlet 126 and discharge outlet 128, as shown. Preferably, both the discharge outlet 128 and helical pathway 130 are configured to assist imparting at least one spiraling motion 132 to airflow 108 exiting discharge outlet 128. The preferred spiraling motion of airflow 108 assists the generation of the localized negative-pressure region 112.

Preferably, each micro-Bernoulli module 102 comprises a plurality of fluid channels 116 preferably arranged generally uniformly about the circumferential side wall 124, as shown. Preferably, each micro-Bernoulli module 102 comprises at least four individual fluid channels 116 that are preferably located along the outer circumferential side wall 124, as shown. Upon reading this specification, those with ordinary skill in the art will now appreciate that, under appropriate circumstances, considering such issues as design preference, application requirements, cost, structural requirements, available materials, technological advances, etc., other physical arrangements such as, for example, alternate shape geometries, alternate numbers of flow channels, alternate flow patterns, alternate dimple-capture geometries, etc., may suffice.

As previously noted, central recess 110 is preferably situate generally within the localized negative-pressure region 112 induced by the spiraling motion of the airflow 108 exiting the plurality of channels 116. Preferably, the dimple-shaped central recess 110 (at least embodying herein such at least one recessed dimple) is centrally positioned on outer face 120, as shown, and is preferably structured and arranged to form the above-described dimple capturer 134. Preferably, dimple-shaped central recess 110 comprises a generally circular bore that is preferably generally coaxial with disc-shaped body 118, as shown.

Figure 3:
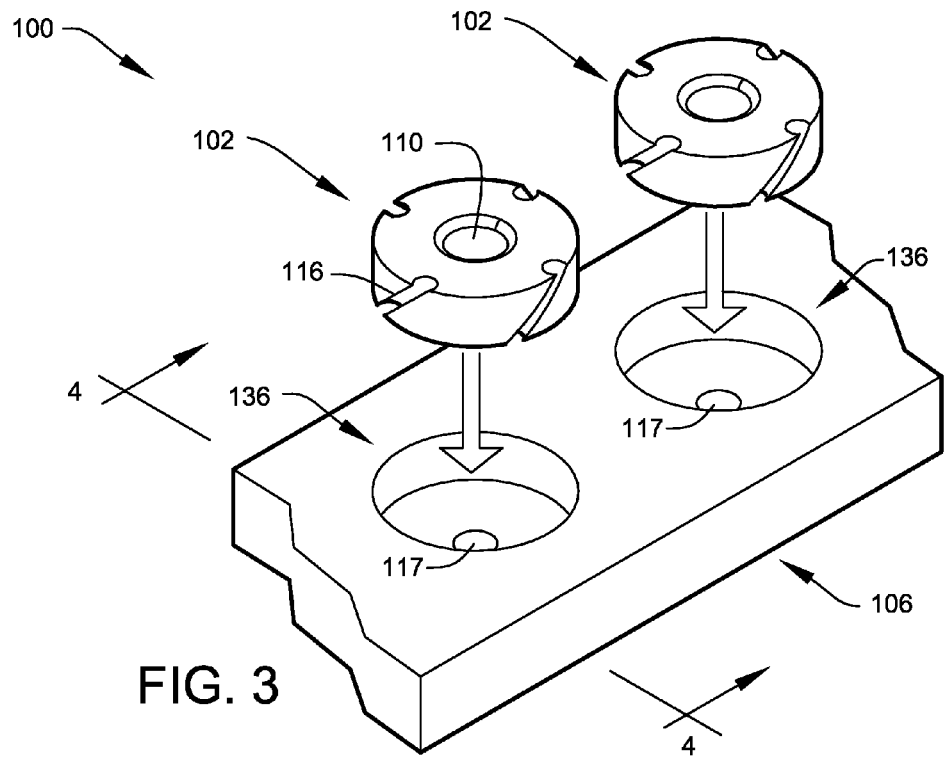
FIG. 3 shows an exploded perspective view, illustrating a wafer-transport tool configured to accept a plurality of micro-Bernoulli modules, according to a preferred embodiment of the present invention.
Figure 4:
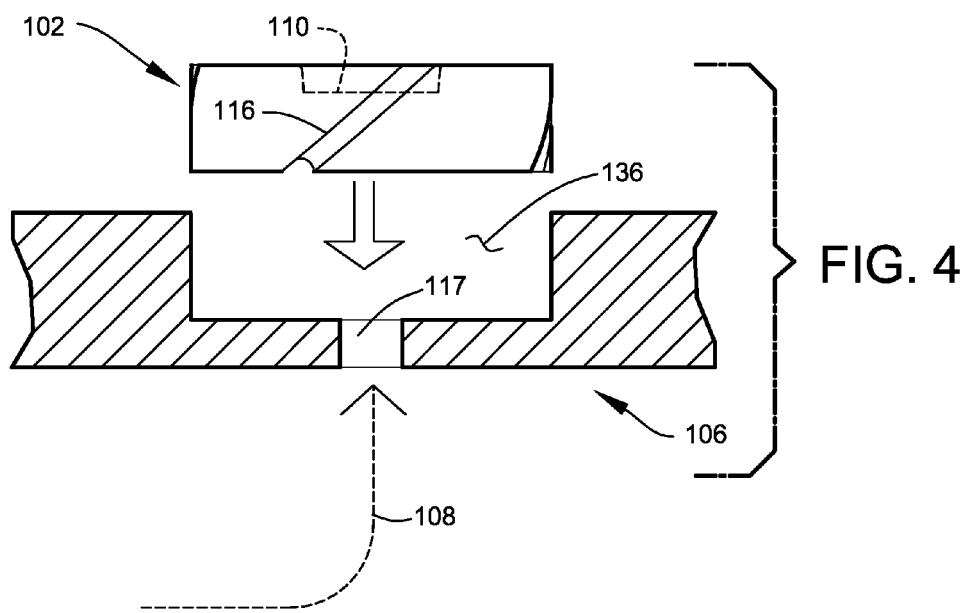
FIG. 4 shows the exploded sectional view 4-4 of FIG. 3 according to the preferred embodiment of FIG. 1.

FIG. 3 shows a partial perspective view, illustrating a portion of a transport-assist tool 106 preferably configured to accept a plurality of micro-Bernoulli modules 102, according to a preferred embodiment of the present invention. FIG. 4 shows the sectional view 4-4 of FIG. 3 according to the preferred embodiment of FIG. 1.

In preferred embodiments of the present system, transport-assist tool 106 preferably comprises a set of modular receivers 136 preferably configured to removably receive a single micro-Bernoulli module 102. As shown in sectional view of FIG. 4, each receiver 136 is preferably configured with at least one fluid port 117 to supply micro-Bernoulli module 102 with airflow 108 (clean dry air or a similar flow of fluid) when micro-Bernoulli module 102 is engaged within receiver 136. Airflow 108 may be derived form, for example, an electrically-driven air pressure converter. Preferably, each micro-Bernoulli module 102 is of a physically-modular design. This allows a designer or system operator to conveniently increase or decrease the number of deflection capture points, as required by the application. Thus, a versatile range of non-contact Bernoulli-based chucks, wands, etc. may be developed using applicant's system.

Figure 5:
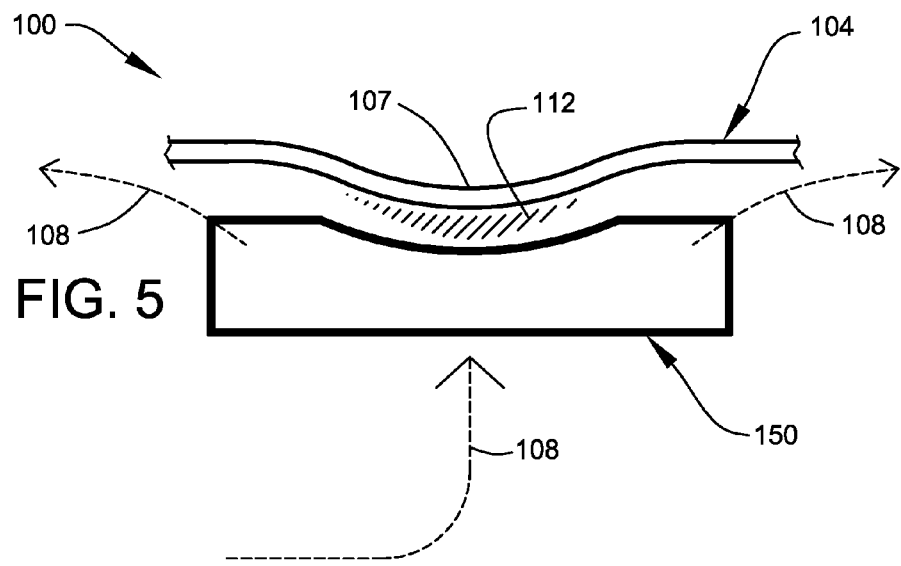
FIG. 5 shows a schematic diagram illustrating a thin planar workpiece positioned adjacent an alternate transport-assist tool in a manner limiting relative lateral movement between the two structures, according to another preferred embodiment of the present invention.
Figure 6:
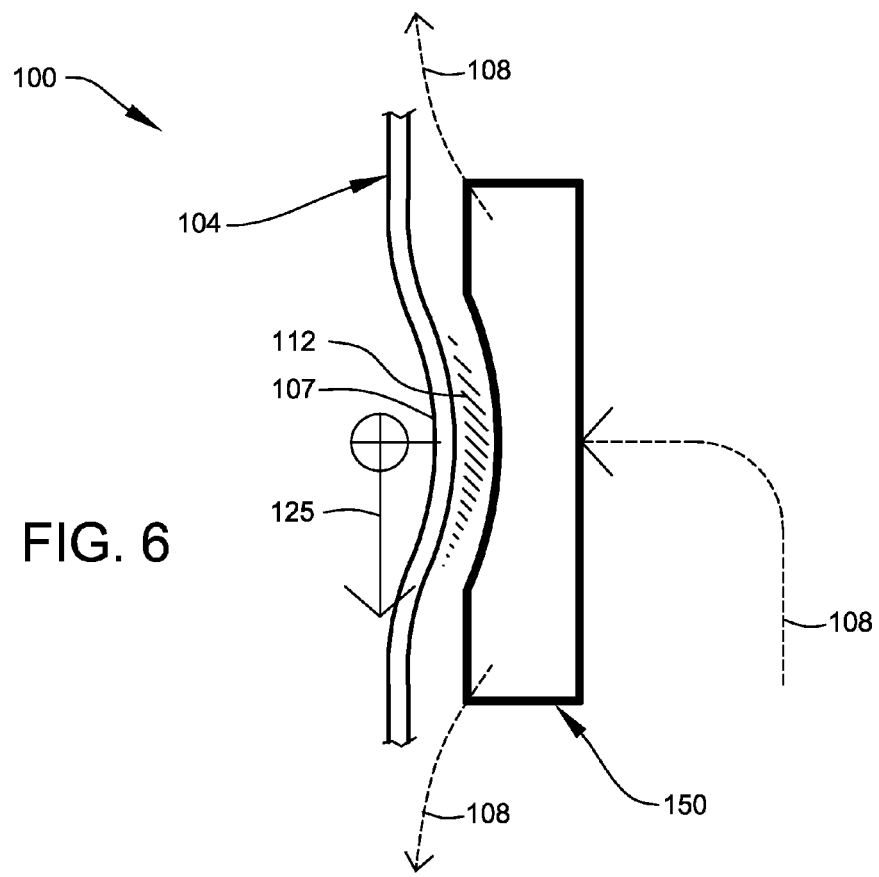
FIG. 6 shows a schematic diagram illustrating the thin planar workpiece held in a stable vertical position by the alternate transport-assist tool of FIG. 5.

FIG. 5 shows a schematic diagram illustrating thin planar workpiece 104 positioned adjacent an alternate transport-assist tool 150 in a manner limiting relative lateral movement between the two structures, according to another preferred embodiment of the present invention. FIG. 5 generally demonstrates an alternate preferred geometry of dimple capturer 134, which may preferably include shallow surface recesses, as shown. FIG. 6 shows a schematic diagram illustrating thin planar workpiece 104 held in a stable vertical position by the alternate transport-assist tool 150 of FIG. 5. The preferred embodiments of the present system are preferably structured and arranged to assist stable multi-orientation positioning of the thin planar workpiece 104 (preferably including the depicted vertical orientation resisting gravity load 125) during transport by transport-assist tool 106 between a first location and a second location. A distinct advantage of applicant's system is the lack of all physical contact between the thin planar workpiece 104 and transport-assist tool 106 during transport (at least embodying herein transport-assist tool means for assisting stable transport of the at least one thin planar workpiece between a first location and a second location, wherein such transport-assist tool means comprises non-contact positioner means for non-contact positioning of the at least one thin planar workpiece adjacent such transport-assist tool means).

Figure 7:
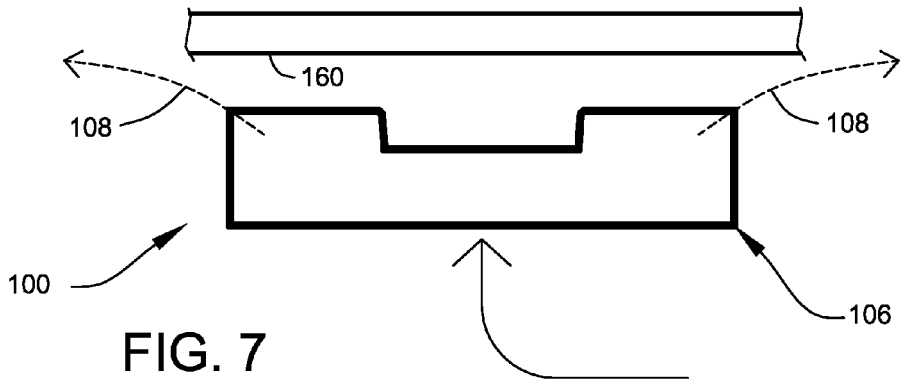
FIG. 7 shows a schematic diagram illustrating a thick planar workpiece positioned adjacent the transport-assist tool in a manner limiting relative lateral movement between the two structures, according to another preferred embodiment of the present invention.

FIG. 7 shows a schematic diagram illustrating a thick planar workpiece 160 positioned adjacent transport-assist tool 106 in a manner limiting relative lateral movement between the two structures, according to another preferred embodiment of the present invention. Although the preferred embodiments of the present system are useful in handling thin and ultra-thin silicon wafers (<200 um thick), in this alternate application, the thick planar workpiece 160 is positioned by enhanced Bernoulli interaction preferably achieved by increasing the relative pressure of airflow 108 supplied to micro-Bernoulli module 102.

Figure 8:
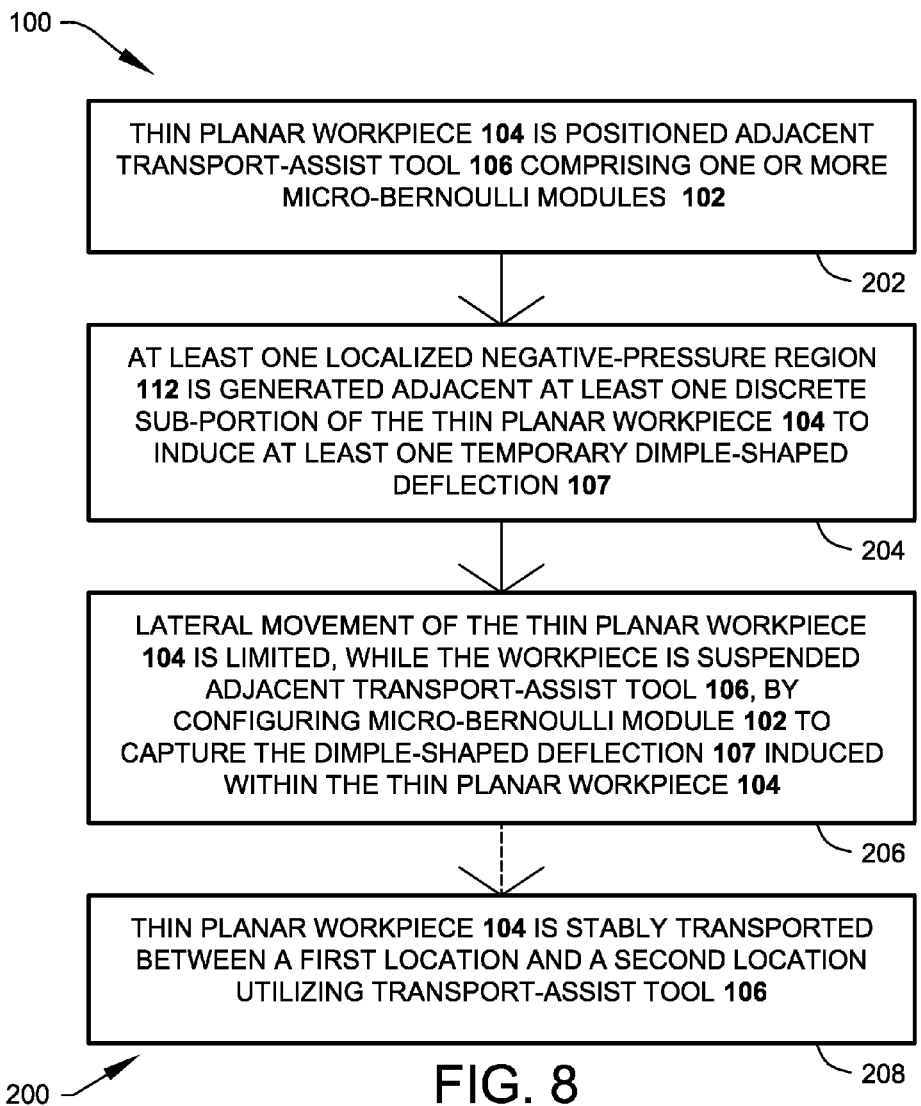
FIG. 8 shows a flow diagram generally illustrating the preferred steps of a method relating to the transport of the thin planar workpiece by the preferred embodiments of the present invention.

FIG. 8 shows a flow diagram generally illustrating the preferred steps of method 200 relating to the transport of thin planar workpiece 104 by the above-described embodiments of non-contact transport system 100. In that regard, method 200 generally comprises the following preferred steps. First, as indicated in preferred step 202, thin planar workpiece 104 is positioned adjacent transport-assist tool 106 comprising one or more micro-Bernoulli modules 102 (at least embodying herein at least one non-contact positioned) using at least one flow of fluid in accordance with Bernoulli's principle (at least embodying wherein such non-contact positioner means comprises Bernoulli suspender means for suspending the at least one thin planar workpiece adjacent the at least one transport-assist tool using at least one flow of fluid in accordance with Bernoulli's principle).

Next, at least one localized negative-pressure region 112 is generated adjacent at least one discrete sub-portion of the thin planar workpiece 104 to induce at least one temporary dimple-shaped deflection 107, as indicated in preferred step 204 (at least embodying herein localized low-pressure inducer means for inducing at least one localized low-pressure region adjacent at least one discrete sub-portion of the at least one thin planar workpiece). Next, lateral movement of the thin planar workpiece 104 is limited, while the workpiece is suspended adjacent transport-assist tool 106, by configuring micro-Bernoulli module 102 to capture the dimple-shaped deflection 107 induced within the thin planar workpiece 104, as indicated in preferred step 206 (at least embodying herein lateral-movement limiter means for limiting lateral movement of the at least one thin planar workpiece while suspended adjacent such transport-assist tool means, wherein such lateral-movement limiter means comprises temporary dimple-deflection inducer means for temporarily inducing at least one dimple-shaped deflection within the at least one thin planar workpiece, and within such transport-assist tool means, dimple capturer means for non-contact capturing of the at least one dimple-shaped deflection induced within the at least one thin planar workpiece).

In additional preferred step 208 of method 200, thin planar workpiece 104 is stably transported between a first location and a second location utilizing transport-assist tool 106.

Although applicant has described applicant's preferred embodiments of this invention, it will be understood that the broadest scope of this invention includes modifications such as diverse shapes, sizes, and materials. Such scope is limited only by the below claims as read in connection with the above specification. Further, many other advantages of applicant's invention will be apparent to those skilled in the art from the above descriptions and the below claims.

What is claimed is:

1. A method relating to the transport of at least one thin planar workpiece comprising the steps of:
    a) positioning the at least one thin planar workpiece adjacent at least one transport-assist tool comprising at least one non-contact positioner using at least one flow of fluid in accordance with Bernoulli's principle;
    b) generating at least one localized negative-pressure region adjacent at least one discrete sub-portion of the at least one thin planar workpiece to induce at least one temporary dimple-shaped deflection within the at least one thin planar workpiece; and
    c) limiting lateral movement of the at least one thin planar workpiece while the at least one thin planar workpiece is suspended adjacent such transport-assist tool by configuring such at least one transport-assist tool to capture the at least one dimple-shaped deflection induced within the at least one thin planar workpiece.

2. The method, according to claim 1, further comprising the step of stably transporting the at least one thin planar workpiece between a first location and a second location utilizing at least one transport-assist tool.

3. A system relating to the transport of at least one thin planar workpiece comprising:
    a) at least one transport-assist tool configured to assist stable transport of the at least one thin planar workpiece between a first location and a second location;
    b) wherein said at least one transport-assist tool comprises at least one non-contact positioner configured to assist non-contact positioning of the at least one thin planar workpiece adjacent such at least one transport tool;
    c) wherein said at least one non-contact positioner comprises
        i) at least one Bernoulli suspender structured and arranged to assist suspension of the at least one thin planar workpiece adjacent the at least one transport-assist tool using at least one flow of fluid in accordance with Bernoulli's principle, and
        ii) at least one lateral-movement limiter structured and arranged to limit lateral movement of the at least one thin planar workpiece while the at least one thin planar workpiece is suspended adjacent said transport-assist tool;
    d) wherein said at least one lateral-movement limiter comprises
        i) at least one temporary dimple-deflection inducer configured to assist inducing temporarily at least one dimple-shaped deflection within the at least one thin planar workpiece, and
        ii) within said at least one transport-assist tool, at least one dimple capturer structured and arranged to assist non-contact capturing of the at least one dimple-shaped deflection induced within the at least one thin planar workpiece; and
    e) wherein said at least one dimple-deflection inducer comprises at least one localized negative-pressure inducer configured to assist inducement of at least one localized negative-pressure region adjacent at least one discrete sub-portion of the at least one thin planar workpiece.

4. The system, according to claim 3, wherein said at least one localized negative-pressure inducer comprises at least one fluid director configured to assist directing the at least one flow of fluid in at least one flow pattern generating at least one localized negative-pressure region.

5. The system, according to claim 4, wherein:
    a) said at least one fluid director is structured and arranged to assist imparting at least one spiraling motion to the at least one flow of fluid; and
    b) such at least one spiraling motion of the at least one flow of fluid produces, within the at least one flow of fluid the at least one localized negative-pressure region.

6. The system, according to claim 4, wherein said at least one fluid director comprises:
    a) at least one channel configured to channel the at least one flow of fluid;
    b) wherein said at least one channel comprises
        i) at least one inlet to inlet the at least one flow of fluid,
        ii) at least one discharge outlet to discharge the at least one flow of fluid, and
        iii) at least one helical path in fluid communication with said at least one inlet and said at least one discharge outlet;
    c) wherein said at least one helical path is configured to assist imparting at least one spiraling motion to the at least one flow of fluid on exiting said at least one discharge outlet; and
    d) such at least one spiraling motion of the at least one flow of fluid assists the generation of the at least one localized negative-pressure region.

7. The system, according to claim 6, wherein said at least one non-contact positioner further comprises:
    a) at least one micro-Bernoulli module structured and arranged to at least comprise said at least one Bernoulli suspender and said at least one lateral-movement limiter;
    b) wherein said at least one transport-assist tool comprises at least one receiver configured to removably receive said at least one micro-Bernoulli module; and
    c) wherein said at least one receiver is configured to supply to said at least one micro-Bernoulli module the at least one flow of fluid when at least one micro-Bernoulli module is engaged within said at least one receiver.

8. The system, according to claim 7, wherein said at least one transport-assist tool comprises a plurality of said at least one micro-Bernoulli modules.

9. The system, according to claim 7, wherein each said at least one micro-Bernoulli module comprises:
    a) at least one disc-shaped body having at least one outer face, at least one inner face, and at least one circumferential side wall adjoining said at least one outer face and said at least one inner face;
    b) a plurality of said at least one channels arranged generally uniformly about said at least one circumferential side wall to assist inducing such at least one localized negative-pressure region; and
    c) within said least one outer face, at least one recessed dimple structured and arranged to form said at least one dimple capturer;

d) wherein said at least one recessed dimple is situate generally within such at least one localized negative-pressure region induced by such at least one spiraling motion of the at least one flow of fluid exiting said plurality of said at least one channels.

10. The system, according to claim 9, wherein said at least one inner face is spaced apart from and substantially parallel to said outer face.

11. A method relating to the transport of at least one thin planar workpiece comprising the steps of:
  a) providing at least one transport-assist tool comprising at least one non-contact positioner configured to assist non-contact positioning of the at least one thin planar workpiece adjacent such at least one transport tool;
  b) providing within such at least one non-contact positioner
    i) at least one Bernoulli suspender structured and arranged to assist suspension of the at least one thin planar workpiece adjacent the at least one transport-assist tool using at least one flow of fluid in accordance with Bernoulli's principle, and
    ii) at least one lateral-movement limiter structured and arranged to limit lateral movement of the at least one thin planar workpiece while the at least one thin planar workpiece is suspended adjacent said transport-assist tool;
  c) configuring such at least one lateral-movement limiter to comprise
    i) at least one temporary dimple-deflection inducer configured to assist inducing temporarily at least one dimple-shaped deflection within the at least one thin planar workpiece, and
    ii) within such at least one transport-assist tool, at least one dimple capturer structured and arranged to assist non-contact capturing of the at least one dimple-shaped deflection induced within the at least one thin planar workpiece; and
  d) providing within such at least one dimple-deflection inducer, at least one localized negative-pressure inducer configured to assist inducement of at least one localized negative-pressure region adjacent at least one discrete sub-portion of the at least one thin planar workpiece.

12. The method, according to claim 11, further comprising the step of providing within such at least one localized negative-pressure inducer, at least one fluid director configured to assist directing the at least one flow of fluid in at least one flow pattern generating at least one localized negative-pressure region.

13. The method, according to claim 12, further comprising the steps of:
  a) arranging such at least one fluid director to assist imparting at least one spiraling motion to the at least one flow of fluid; and
  b) assisting the production, within the at least one flow of fluid, of the of at least one localized negative-pressure region.

14. The method, according to claim 13, further comprising the steps of:
  a) providing within such at least one fluid director, at least one channel configured to channel the at least one flow of fluid;
  b) providing within such at least one channel
    i) at least one inlet to inlet the at least one flow of fluid,
    ii) at least one discharge outlet to discharge the at least one flow of fluid, and
    iii) at least one helical path in fluid communication with such at least one inlet and such at least one discharge outlet; and
  c) arranging such at least one helical path to assist imparting at least one spiraling motion to the at least one flow of fluid on exiting said at least one discharge outlet wherein the generation of the at least one localized negative-pressure region is assisted.

15. The method, according to claim 14, further comprising the steps of:
  a) combining such at least one Bernoulli suspender and such at least one lateral-movement limiter within at least one micro-Bernoulli module;
  b) configuring such at least one transport-assist tool to removably receive said at least one micro-Bernoulli module; and
  c) configuring such at least one receiver to supply to such at least one micro-Bernoulli module the at least one flow of fluid when such at least one micro-Bernoulli module is engaged within such at least one receiver.

16. The method, according to claim 15, further comprising the step of providing within such at least one transport-assist tool a plurality of such at least one micro-Bernoulli modules.

17. The method, according to claim 16, further comprising the step of configuring each such at least one micro-Bernoulli module to comprise:
  a) at least one disc-shaped body having at least one outer face, at least one inner face, and at least one circumferential side wall adjoining such at least one outer face and such at least one inner face;
  b) a plurality of such at least one channels arranged generally uniformly about such at least one circumferential side wall to assist inducing such at least one localized negative-pressure region;
  c) within such least one outer face, at least one recessed dimple structured and arranged to form such at least one dimple capturer; and
  d) situating such at least one recessed dimple generally within such at least one localized negative-pressure region induced by such at least one spiraling motion of the at least one flow of fluid exiting such plurality of such at least one channels.

18. The method, according to claim 17, further comprising the step of arranging such at least one inner face in a spaced apart and substantially parallel orientation relative to such outer face.

19. A system relating to the transport of at least one thin planar workpiece comprising:
  a) transport-assistor means for assisting stable transport of the at least one thin planar workpiece between a first location and a second location;
  b) wherein said transport-assistor means comprises non-contact positioner means for non-contact positioning of the at least one thin planar workpiece adjacent said transport-assistor means;
  c) wherein said non-contact positioner means comprises
    i) Bernoulli suspender means for suspending the at least one thin planar workpiece adjacent said transport-assistor means using at least one flow of fluid in accordance with Bernoulli's principle, and
    ii) lateral-movement limiter means for limiting lateral movement of the at least one thin planar workpiece while suspended adjacent said transport-assistor means;

d) wherein said lateral-movement limiter means comprises
   i) temporary dimple-deflection inducer means for temporarily inducing at least one dimple-shaped deflection within the at least one thin planar workpiece, and
   ii) within said transport-assistor means, dimple capturer means for non-contact capturing of the at least one dimple-shaped deflection induced within the at least one thin planar workpiece; and
e) wherein said temporary dimple-deflection inducer means comprises localized negative-pressure inducer means for inducing at least one localized negative-pressure region adjacent at least one discrete sub-portion of the at least one thin planar workpiece.

\* \* \* \* \*